United States Patent
Lu

(10) Patent No.: US 10,445,553 B2
(45) Date of Patent: Oct. 15, 2019

(54) PACKAGE STRUCTURE OF FINGERPRINT IDENTIFICATION CHIP

(71) Applicant: Primax Electronics Ltd., Taipei (TW)

(72) Inventor: Tsung-Yi Lu, Taipei (TW)

(73) Assignee: PRIMAX ELECTRONICS LTD., Taipei (TW)

( * ) Notice: Subject to any disclaimer, the term of this patent is extended or adjusted under 35 U.S.C. 154(b) by 122 days.

(21) Appl. No.: 15/830,651

(22) Filed: Dec. 4, 2017

(65) Prior Publication Data

US 2019/0026533 A1   Jan. 24, 2019

(30) Foreign Application Priority Data

Jul. 21, 2017   (TW) .............................. 106124639 A

(51) Int. Cl.
*G06K 9/00* (2006.01)
*H01L 23/04* (2006.01)
(Continued)

(52) U.S. Cl.
CPC ..... *G06K 9/00087* (2013.01); *G06K 9/00053* (2013.01); *H01L 21/50* (2013.01); *H01L 23/04* (2013.01); *H01L 23/08* (2013.01); *H01L 23/10* (2013.01); *H01L 23/13* (2013.01); *H01L 23/14* (2013.01); *H01L 23/3142* (2013.01); *H01L 23/4985* (2013.01); *H01L 23/142* (2013.01); *H01L 24/05* (2013.01); *H01L 24/29* (2013.01); *H01L 24/32* (2013.01); *H01L 24/33* (2013.01); *H01L 24/48* (2013.01); *H01L 24/73* (2013.01);
(Continued)

(58) Field of Classification Search
CPC .............. G06K 9/00087; H01L 23/481; H01L 23/49833; H01L 23/13; H01L 23/3142; H01L 24/73; H01L 23/562; H01L 23/08; H01L 23/10; H01L 24/32; H01L 24/48; H01L 24/05; H01L 23/4985; H01L 23/04; H01L 23/145; H01L 23/525; H01L 2924/181; H01L 2224/73265; H01L 2224/32225; H01L 2224/48091; H01L 23/15; H01L 2224/48227; H01L 2224/48106; H01L 2224/04042

USPC ....................................... 382/124
See application file for complete search history.

(56) References Cited

U.S. PATENT DOCUMENTS 10,061,966 B2 *   8/2018   Lee .................... G06K 9/0002
2015/0294135 A1 *   10/2015   Kim ...................... H01L 23/04
(Continued)

*Primary Examiner* — Van D Huynh
(74) *Attorney, Agent, or Firm* — Kirton McKonkie; Evan R. Witt

(57) ABSTRACT

The present invention provides a package structure of a fingerprint identification chip, including: a metal substrate, having a through opening and two grooves extending from two opposite sides of the through opening; a fingerprint identification chip, disposed in the through opening and having an upper surface and a lower surface, the lower surface having a bonding pad; a cover plate, fixedly disposed on the metal substrate and covering the upper surface of the fingerprint identification chip; a flexible printed circuit (FPC), disposed on the lower surface of the fingerprint identification chip and having a first surface and a second surface, the second surface having a first metal contact; and a metal reinforcing plate, inserted into the two grooves and covering the through opening, where the bonding pad is electrically connected to the first metal contact through a wire.

17 Claims, 4 Drawing Sheets

(51) Int. Cl.
*H01L 23/498* (2006.01)
*H01L 23/10* (2006.01)
*H01L 23/14* (2006.01)
*H01L 23/08* (2006.01)
*H01L 23/31* (2006.01)
*H01L 23/13* (2006.01)
*H01L 21/50* (2006.01)
H01L 23/00 (2006.01)

(52) U.S. Cl.
CPC .... *H01L 24/92* (2013.01); *H01L 2224/04042* (2013.01); *H01L 2224/29194* (2013.01); *H01L 2224/32225* (2013.01); *H01L 2224/32245* (2013.01); *H01L 2224/33181* (2013.01); *H01L 2224/4824* (2013.01); *H01L 2224/48106* (2013.01); *H01L 2224/48227* (2013.01); *H01L 2224/73215* (2013.01); *H01L 2224/73265* (2013.01); *H01L 2224/8592* (2013.01); *H01L 2224/92147* (2013.01); *H01L 2224/92247* (2013.01); *H01L 2924/3511* (2013.01)

(56) References Cited

U.S. PATENT DOCUMENTS

| | | | |
|---|---|---|---|
| 2017/0243045 A1* | 8/2017 | Chang | G06K 9/0002 |
| 2017/0287797 A1* | 10/2017 | Wang | H01L 23/32 |
| 2018/0015711 A1* | 1/2018 | Wu | B32B 37/1284 |
| 2018/0054313 A1* | 2/2018 | Wu | G06F 21/32 |
| 2018/0145102 A1* | 5/2018 | Wang | G06K 9/0002 |

* cited by examiner

PACKAGE STRUCTURE OF FINGERPRINT IDENTIFICATION CHIP

FIELD OF THE INVENTION

The present invention relates to the field of chip package applications, and in particular, to a package structure of a fingerprint identification chip.

BACKGROUND OF THE INVENTION

With the advance in science and technology, fingerprint recognition modules with a fingerprint recognition function have been widely set in electronic devices and have become one of the standard configurations of the electronic devices. A user may carry out identity recognition by using the fingerprint recognition module, so as to further unlock the electronic device or perform an operation on a software interface.

In the prior art, as shown in FIG. 1, FIG. 1 is a cross-sectional view of a conventional package structure of a fingerprint identification chip. In FIG. 1, a fingerprint identification module 20 is packaged by using a land grid array (LGA) technology and includes: a fingerprint identification chip 21, a substrate 22, an epoxy molding compound (EMC) layer 23 covering the fingerprint identification chip 21 and the substrate 22, a cover plate 24, a flexible print circuit (FPC) 25, and a reinforcing plate 26. An upper surface of the fingerprint identification chip 21 is provided with a bonding pad 211. The substrate 25 is provided with a metal contact 221. The bonding pad 211 is electrically connected to the metal contact 221 through a wire W.

In the prior art, the thickness of the cover plate 24 of the fingerprint identification module 20 is between 120 μm and 250 μm. The thickness of the substrate 22 is between 130 μm and 310 μm. The thickness of the fingerprint identification chip 21 is between 150 μm and 400 μm. In order to protect the wire W and maintain mechanical strength thereof, the thickness of the EMC layer 23 is usually the thickness of the fingerprint identification chip 21 plus 50 μm. The thickness of the FPC 25 and the thickness of the reinforcing plate 26 are both 120 μm. In addition, after packaging is completed, it is necessary to add the thickness of a pouring sealant, which is approximately 20 μm, and the thickness of tin soldering, which is approximately 60 μm. In the current trend of making electronic devices lighter and thinner, although the thickness of the fingerprint identification module 20 manufactured by using a conventional packaging technology can be as thin as 770 μm, the shrinkage characteristic of packaging materials may cause the fingerprint identification module 20 to warp and cause the fingerprint identification module 20 to lose the due mechanical strength.

Accordingly, how to provide a package structure of a fingerprint identification chip so that the fingerprint identification chip can avoid warping while maintaining desirable mechanical strength thereof during a thinning process is a technical issue to be solved by the present invention.

SUMMARY OF THE INVENTION

A main objective of the present invention is to provide a package structure of a fingerprint identification chip that is thin while maintaining good mechanical strength.

To achieve the foregoing objective, the present invention provides a package structure of a fingerprint identification chip, including:

a metal substrate, having a through opening and two grooves extending from two opposite sides of the through opening;

a fingerprint identification chip, disposed in the through opening and having an upper surface and a lower surface, the lower surface having a bonding pad;

a cover plate, fixedly disposed on the metal substrate and covering the upper surface of the fingerprint identification chip;

a flexible printed circuit (FPC), disposed on the lower surface of the fingerprint identification chip and having a first surface and a second surface, the second surface having a first metal contact; and a metal reinforcing plate, inserted into the two grooves and covering the through opening;

where the bonding pad is electrically connected to the first metal contact through a wire.

In the foregoing preferred implementation, a colloid is coated on the at least one bonding pad, the wire and the first metal contact, and the colloid is an underfill.

In the foregoing preferred implementation, a film layer is formed between the metal substrate and the cover plate and is used for bonding the metal substrate and the cover plate.

In the foregoing preferred implementation, the cover plate includes a first mucilage layer that is formed at a position corresponding to the through opening and used for bonding the upper surface of the fingerprint identification chip.

In the foregoing preferred implementation, a second mucilage layer is formed between the lower surface of the fingerprint identification chip and the first surface of the FPC and is used for bonding the fingerprint identification chip and the FPC.

In the foregoing preferred implementation, a second metal contact is formed at another end, which is opposite to the first metal contact, of the FPC.

In the foregoing preferred implementation, the metal reinforcing plate has a circuit opening.

In the foregoing preferred implementation, the FPC passes through the circuit opening.

In the foregoing preferred implementation, at a position of the circuit opening, a bent portion is formed on the FPC.

In the foregoing preferred implementation, a colloid is coated on the circuit opening and the bent portion, and the colloid is an underfill.

In the foregoing preferred implementation, a material of the metal substrate is: stainless steel, tungsten steel, aluminum or tin plate.

In the foregoing preferred implementation, a material of the cover plate is: ceramic or glass.

In the foregoing preferred implementation, a material of the metal reinforcing plate is: stainless steel, tungsten steel, aluminum or tin plate.

In the foregoing preferred implementation, the thickness of the metal substrate is between 430 μm and 450 μm.

In the foregoing preferred implementation, the thickness of the metal substrate is 440 μm.

In the foregoing preferred implementation, the thickness of the cover plate is between 110 μm and 130 μm.

In the foregoing preferred implementation, the thickness of the cover plate is 120 μm.

DETAILED DESCRIPTION OF THE PREFERRED EMBODIMENT

Advantages and features of the present invention and methods for achieving the advantages and features will be described in further detail with reference to the exemplary embodiments and accompanying drawings, so as to be easier to understand. However, the present invention may be implemented in different forms, and should not be construed as being limited to the embodiments described herein. On the contrary, for a person of ordinary skill in the art, the provided embodiments make this disclosure more thorough and comprehensive, and convey the scope of the present invention more completely.

Figure 1:
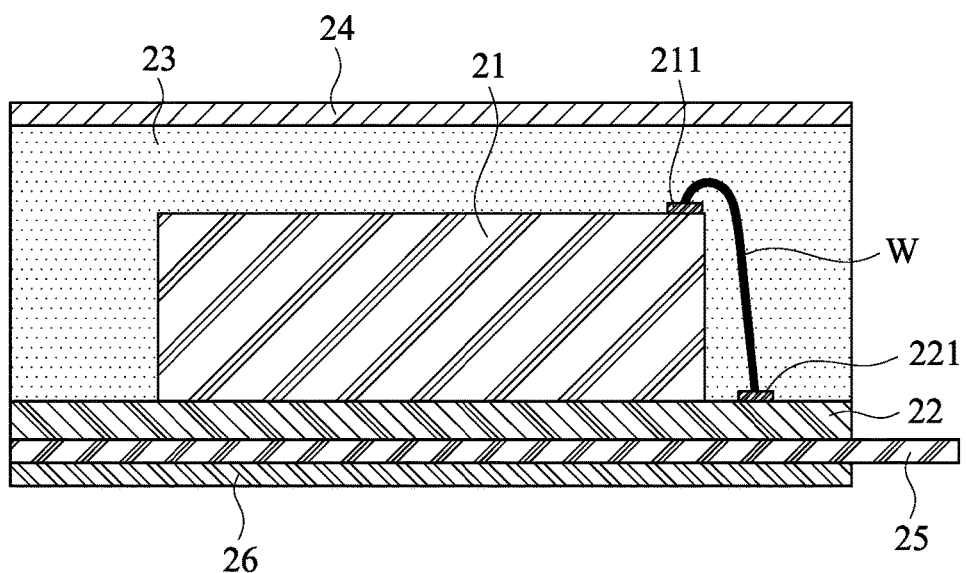
FIG. 1 is a cross-sectional view of a conventional package structure of a fingerprint identification chip.
Figure 2:
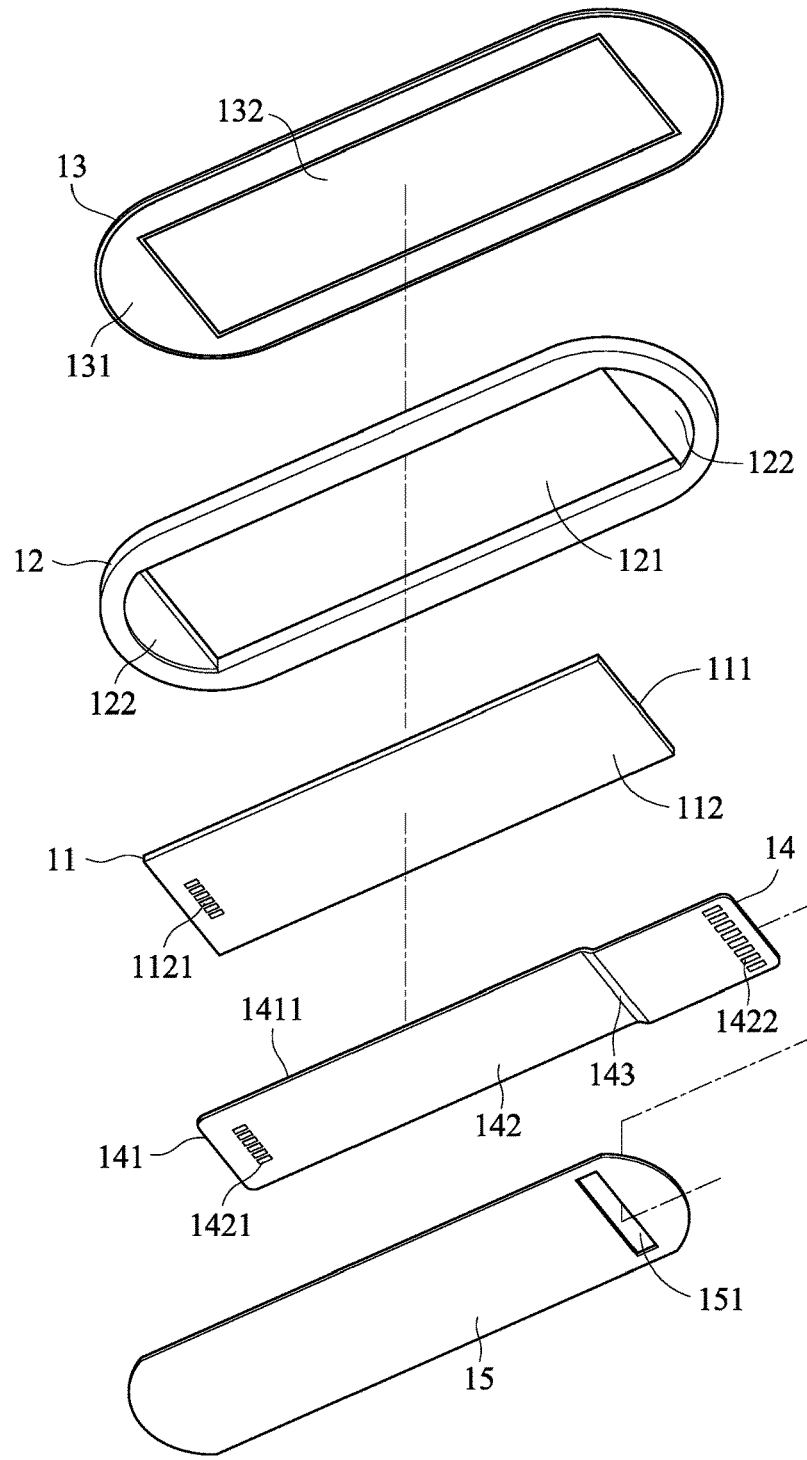
FIG. 2 is a three-dimensional exploded view of a package structure of a fingerprint identification chip according to the present invention.

First, referring to FIG. 2, FIG. 2 is a three-dimensional exploded view of a package structure of a fingerprint identification chip according to the present invention. In FIG. 2, the package structure 10 of a fingerprint identification chip includes: a fingerprint identification chip 11, a metal substrate 12, a cover plate 13, an FPC 14 and a metal reinforcing plate 15.

Referring to FIG. 2 continuously, the fingerprint identification chip 11 has an upper surface 111 and a lower surface 112. In addition, a bonding pad 112 of the fingerprint identification chip 11 may be arranged on the lower surface 112 of the fingerprint identification chip 11 by using a through silicon via (TSV) process technology and a redistribution layer (RDL) process technology. The metal substrate 12 has a through opening 121 and two grooves 122 extending from two opposite sides of the through opening 121. The through opening 121 is used for accommodating the fingerprint identification chip 11. A material of the metal substrate 12 may be: stainless steel, tungsten steel, aluminum or tin plate.

One side of the cover plate 13 includes a film layer 131 and a first mucilage layer 132. The film layer 131 is used for bonding the cover plate 13 with the metal substrate 12. The first mucilage layer 132 is arranged at a position corresponding to the through opening 121 and is used for bonding the upper surface 111 of the fingerprint identification chip 11. The film layer 131 is a hot-pressing double-sided adhesive. The first mucilage layer 132 is a thermosetting hydrogel. A material of the cover plate 13 may be: ceramic or glass. In a preferred implementation, the cover plate 13 is made of sapphire glass. In addition, although the present invention proposes the implementation of arranging the film layer 131 and the first mucilage layer 132 on one side of the cover plate 13, it is also possible to arrange the film layer 131 on one side of the metal substrate 12 or arrange the first mucilage layer 132 on the upper surface 111 of the fingerprint identification chip 11 during actual application. The arrangement manner is not limited to the implementation proposed in the present invention.

The FPC 14 has a first surface 141, a second surface 142 and a bent portion 143. A second mucilage layer 1411 is arranged on the first surface 141 and is used for bonding the lower surface 112 of the fingerprint identification chip 11. The second surface 142 is provided with a first metal contact 1421 at one end and provided with a second metal contact 1422 at an opposite end. The second mucilage layer 1411 is also a thermosetting hydrogel. In addition, although the present invention proposes the implementation of arranging the second mucilage layer 1411 on the first surface 141 of the FPC 14, it is also possible to arrange the second mucilage layer 1411 on the lower surface 112 of the fingerprint identification chip 11 during actual application. The arrangement manner is not limited to the implementation proposed in the present invention.

The metal reinforcing plate 15 has a circuit opening 151. The metal reinforcing plate 15 may be inserted into and accommodated in the two grooves 122 of the metal substrate 12. The circuit opening 151 allows the FPC 14 to pass through. In addition, a material of the metal reinforcing plate 15 may be: stainless steel, tungsten steel, aluminum or tin plate.

Figure 3A:
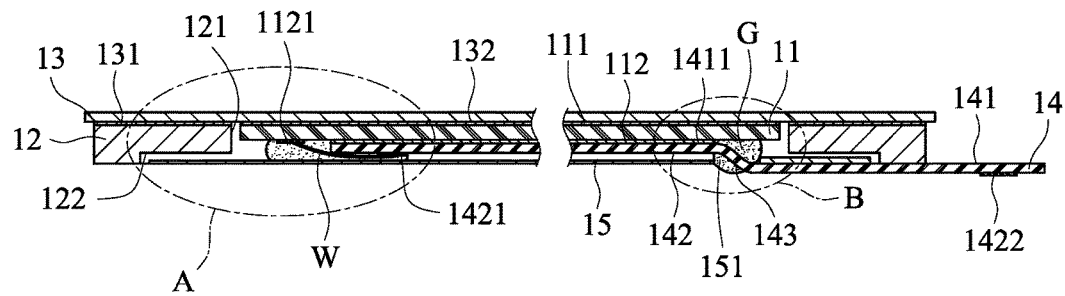
FIG. 3A is a cross-sectional view of a package structure of a fingerprint identification chip according to the present invention.

Next, referring to FIG. 3A, FIG. 3A is a cross-sectional view of a package structure of a fingerprint identification chip according to the present invention. In FIG. 3A, the cover plate 13 can be fixedly disposed on one side of the metal substrate 12 by means of bonding of the film layer 131. On the other hand, the cover plate 13 may also cover the upper surface 111 of the fingerprint identification chip 11 and be bonded with the upper surface 111 of the fingerprint identification chip 11 by means of the first mucilage layer 132, thereby fixing the fingerprint identification chip 11. In this way, the fingerprint identification chip 11 can be disposed in the through opening 121 of the metal substrate 12. The FPC 14 is disposed on the lower surface 112 of the fingerprint identification chip 11 and is bonded with the lower surface 112 of the fingerprint identification chip 11 by means of the second mucilage layer 1411. In addition, the depth of the through opening 121 is greater than a sum of the thickness of the fingerprint identification chip 11 and the thickness of the FPC 14, so that the through opening 121 can completely accommodate the fingerprint identification chip 11 and the FPC 14. The bonding pad 1121 arranged on the lower surface 112 of the fingerprint identification chip 11 is electrically connected to the first metal contact 1421 of the second surface 142 of the FPC 14 through a wire W. Subsequently, the metal reinforcing plate 15 can be inserted into the two grooves 122 of the metal substrate 12 and can completely cover the through opening 121 of the metal substrate 12. On the other hand, the metal reinforcing plate 15 may be first bonded with the second surface 142 of the FPC 14 by using a thermosetting adhesive (not shown in the figure), so as to improve mechanical strength of the FPC 14. Then, the metal reinforcing plate 15 is fixed in the two grooves 122 of the metal substrate 12 by means of laser welding or colloid bonding.

Referring to FIG. 3A continuously, a part of the FPC 14 that is not bonded with the lower surface 112 of the fingerprint identification chip 11 passes through the circuit opening 151 of the metal reinforcing plate 15 and the bent portion 143 of the FPC 14 is provided at a position corresponding to the circuit opening 151. The second metal contact 1422 of the FPC 14 is disposed outside the package structure 10 of the fingerprint identification chip and is used for being electrically connected to a metal contact of a main circuit board of an electronic device (not shown in the figure), such that fingerprint data detected by the fingerprint identification chip 11 is output to the electronic device for subsequent processing of the fingerprint data.

Referring to FIG. 3A continuously, in FIG. 3A, the thickness of the cover plate 13 is between 110 μm and 130 μm; the thickness of the film layer 131 is approximately 20

μm; the thickness of the metal substrate 12 is between 430 μm and 450 μm; the thickness of the metal reinforcing plate 15 is between 110 μm and 130 μm. Because the metal reinforcing plate 15 can be inserted into and accommodated in the two grooves 122 of the metal substrate 12 with affecting the overall thickness of the package structure 10 of the fingerprint identification chip, the overall thickness of the package structure 10 of the fingerprint identification chip may be between 560 μm and 600 μm. In a preferred implementation, the thickness of the cover plate 13 is 120 μm; the thickness of the film layer 131 is approximately 20 μm; the thickness of the metal substrate 12 is 440 μm; the thickness of the metal reinforcing plate 15 is 120 μm. The overall thickness of the package structure 10 of the fingerprint identification chip is 580 μm.

Figure 3B:
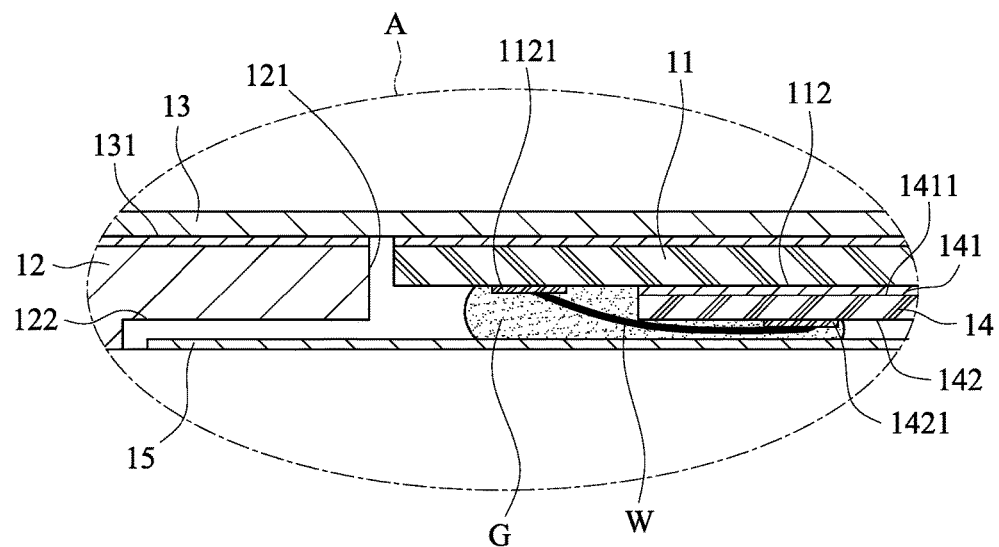
FIG. 3B is an enlarged view of a region A in FIG. 3A.

Referring to FIG. 3B, FIG. 3B is an enlarged view of a region A in FIG. 3A. In FIG. 3B, a colloid G may be coated on the bonding pad 1121, the wire W and the first metal contact 1421, to protect the wire W and thereby improve the mechanical strength and impact resistance of the wire W. The colloid G is an underfill.

Figure 3C:
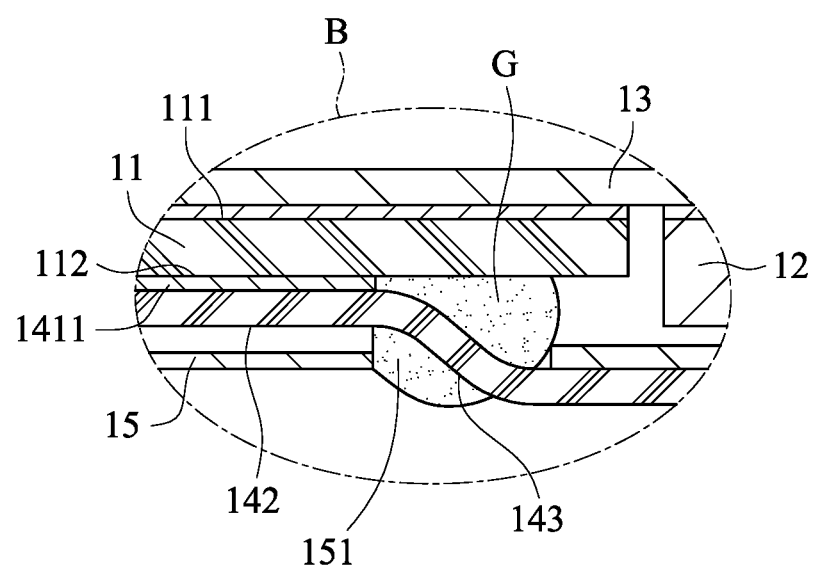
FIG. 3C is an enlarged view of a region B in FIG. 3A.

Next, referring to FIG. 3C, FIG. 3C is an enlarged view of a region B in FIG. 3A. In FIG. 3C, a colloid G is coated on the circuit opening 151 of the metal reinforcing plate 15 and the bent portion 143 of the FPC 14, so as to seal the package structure 10 of the fingerprint identification chip. In this way, moisture or suspended particles in an external environment can be prevented from entering the package structure 10 of the fingerprint identification chip through the circuit opening 151 and affecting operation of the package structure 10. The colloid G is also an underfill.

Compared with the prior art, the present invention provides a thin package structure of a fingerprint identification chip, so as to reduce space required when the fingerprint identification chip is configured in an electronic device. In this way, the flexibility and degree of freedom of electronic circuit configuration inside the electronic device can be effectively improved. On the other hand, the package structure of the fingerprint identification chip, which uses a metal substrate as a main body, can also become thin while maintaining desirable mechanical strength, without causing warping of the appearance. Therefore, the present invention is a creation with great industrial value.

Various modifications may be made to the present invention by a person skilled in the art without departing from the protection scope of the appended claims.

What is claimed is:

1. A package structure of a fingerprint identification chip, comprising:
    a metal substrate, having a through opening and two grooves extending from two opposite sides of the through opening;
    a fingerprint identification chip, disposed in the through opening and having an upper surface and a lower surface, the lower surface having at least one bonding pad;
    a cover plate, fixedly disposed on the metal substrate and covering the upper surface of the fingerprint identification chip;
    a flexible printed circuit (FPC), disposed on the lower surface of the fingerprint identification chip and having a first surface and a second surface, the second surface having a first metal contact; and
    a metal reinforcing plate, inserted into the two grooves and covering the through opening;
    wherein the bonding pad is electrically connected to the first metal contact through a wire.

2. The package structure of a fingerprint identification chip according to claim 1, wherein a colloid is coated on the at least one bonding pad, the wire and the first metal contact, and the colloid is an underfill.

3. The package structure of a fingerprint identification chip according to claim 1, wherein a film layer is formed between the metal substrate and the cover plate and is used for bonding the metal substrate and the cover plate.

4. The package structure of a fingerprint identification chip according to claim 1, wherein the cover plate includes a first mucilage layer that is formed at a position corresponding to the through opening and used for bonding the upper surface of the fingerprint identification chip.

5. The package structure of a fingerprint identification chip according to claim 1, wherein a second mucilage layer is formed between the lower surface of the fingerprint identification chip and the first surface of the FPC and is used for bonding the fingerprint identification chip and the FPC.

6. The package structure of a fingerprint identification chip according to claim 1, wherein a second metal contact is formed at another end, which is opposite to the first metal contact, of the FPC.

7. The package structure of a fingerprint identification chip according to claim 1, wherein the metal reinforcing plate has a circuit opening.

8. The package structure of a fingerprint identification chip according to claim 7, wherein the FPC passes through the circuit opening.

9. The package structure of a fingerprint identification chip according to claim 8, wherein at a position of the circuit opening, a bent portion is formed on the FPC.

10. The package structure of a fingerprint identification chip according to claim 9, wherein a colloid is coated on the circuit opening and the bent portion, and the colloid is an underfill.

11. The package structure of a fingerprint identification chip according to claim 1, wherein a material of the metal substrate is: stainless steel, tungsten steel, aluminum or tin plate.

12. The package structure of a fingerprint identification chip according to claim 1, wherein a material of the cover plate is: ceramic or glass.

13. The package structure of a fingerprint identification chip according to claim 1, wherein a material of the metal reinforcing plate is: stainless steel, tungsten steel, aluminum or tin plate.

14. The package structure of a fingerprint identification chip according to claim 1, wherein the thickness of the metal substrate is between 430 μm and 450 μm.

15. The package structure of a fingerprint identification chip according to claim 14, wherein the thickness of the metal substrate is 440 μm.

16. The package structure of a fingerprint identification chip according to claim 1, wherein the thickness of the cover plate is between 110 μm and 130 μm.

17. The package structure of a fingerprint identification chip according to claim 16, wherein the thickness of the cover plate is 120 μm.

* * * * *